United States Patent [19]

Carroll et al.

[11] Patent Number: 4,631,105
[45] Date of Patent: Dec. 23, 1986

[54] PLASMA ETCHING APPARATUS

[75] Inventors: John C. Carroll, Hayward; Robert A. Shepherd, Jr., Oakland, both of Calif.

[73] Assignee: Branson International Plasma Corporation, Hayward, Calif.

[21] Appl. No.: 725,802

[22] Filed: Apr. 22, 1985

[51] Int. Cl.[4] .............. B44C 1/22; C03C 15/00; C23F 1/00; H01L 21/306
[52] U.S. Cl. .................. 156/345; 156/643; 156/646; 204/298; 204/192.32
[58] Field of Search .............. 156/345, 643, 646; 204/192 EC, 192 E, 298; 219/121 P, 121 PD, 121 PE; 427/38, 39; 118/50.1, 620, 728

[56] References Cited

U.S. PATENT DOCUMENTS 3,879,597  4/1975  Bersin et al. .............. 219/121 P
4,115,184  9/1978  Poulsen .................... 156/643 X
4,158,589  6/1979  Keller et al. .............. 156/345
4,362,632  12/1982 Jacob ...................... 156/345 X

FOREIGN PATENT DOCUMENTS 3102174  12/1981  Fed. Rep. of Germany ...... 156/345
57-43426  3/1982   Japan ..................... 156/345
2123331   1/1984   United Kingdom ........... 156/345

Primary Examiner—William A. Powell
Attorney, Agent, or Firm—Flehr, Hohbach, Test, Albritton & Herbert

[57] ABSTRACT

Apparatus for processing semiconductor wafers and the like in an ionized gas plasma. A reaction chamber is divided into two separate regions, and driven and grounded electrodes are positioned outside the reaction chamber adjacent to respective ones of the regions. Wafers or other workpieces to be processed are placed in the region adjacent to the grounded electrode, and the gas to be ionized is introduced into the region adjacent to the driven electrode. The ionization of the gas is confined to the region adjacent to the driven electrode, and the active species pass through the perforated shield to the wafers or other workpieces.

18 Claims, 3 Drawing Figures

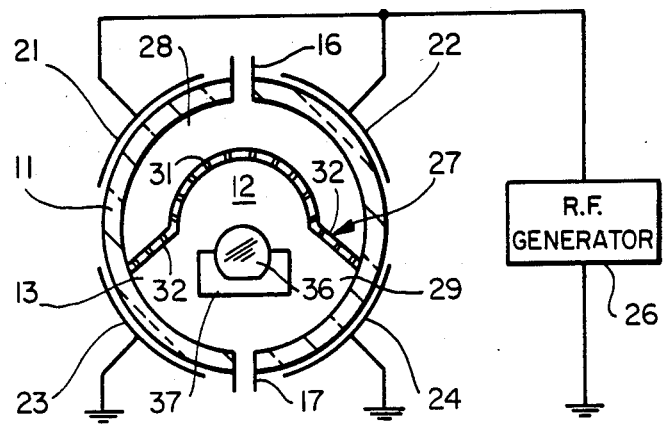
FIG_1
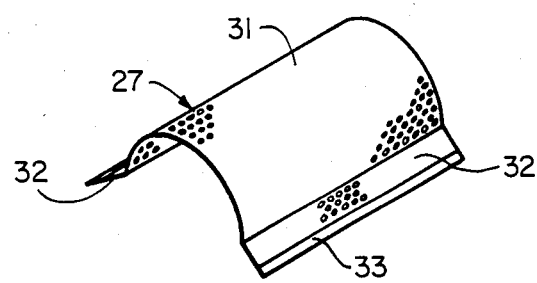
FIG_2
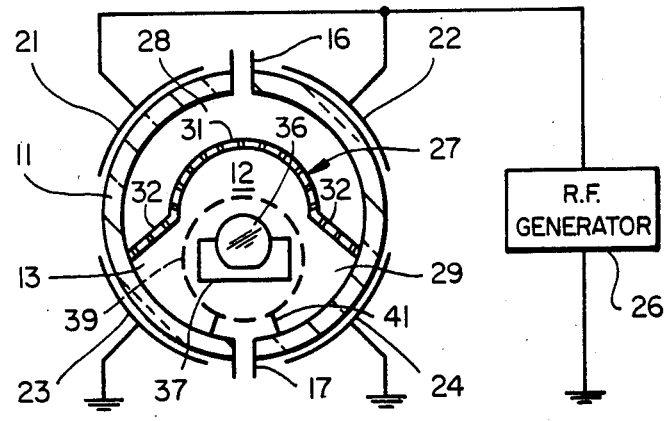
FIG_3

PLASMA ETCHING APPARATUS

This invention pertains generally to gas plasma reactors, and more particularly to apparatus for processing semiconductor wafers and the like in an ionized gas plasma.

In the treatment of semiconductor wafers and other workpieces in an ionized gas plasma, the wafers or other workpieces are placed in a reaction chamber in which a reagent gas is excited with radio frequency energy to form a gas plasma to which the wafers or other workpieces are exposed to effect the desired treatment, e.g. etching of a metallization layer, etching of a passivation layer or a diffusion barrier, or stripping of photoresist.

U.S. Pat. No. 3,879,597 discloses the use of a perforated metal cylinder in the reaction chamber to protect the wafers from ultraviolet radiation and ion bombardment. The perforated cylinder is advantageous in that it permits wafers to be etched at an accelerated rate without discernible attack of photoresist on the wafers. The uniformity of the etch is also improved. However, the perforated cylinder does reduce the speed at which photoresist can be stripped from the wafers in an oxygen plasma.

It is in general an object of the invention to provide new and improved apparatus for processing semiconductor wafers and other workpieces in an ionized gas plasma.

Another object of the invention is to provide apparatus of the above character which permits photoresist to be stripped at a higher rate than when the perforated cylinder of the prior art is used.

These and other objects are achieved in accordance with the invention by dividing the reaction chamber into two separate regions with a perforated shield. This shield extends between opposite sides of the chamber wall, and driven and grounded electrodes are positioned outside the chamber adjacent to respective ones of the regions. The wafers or other workpieces are placed in the region adjacent to the grounded electrode, and the gas to be ionized is introduced to the region adjacent to the driven electrode. The ionization of the gas is confined to the region adjacent to the driven electrode, and the active species of the plasma pass through the perforated shield to the wafers or other workpieces. In one embodiment, the shield is not connected electrically to either electrode, and in another embodiment, it is connected to the grounded electrode.

FIG. 1 is a cross-sectional view, somewhat schematic, of one embodiment of plasma etching apparatus incorporating the invention.

FIG. 2 is an isometric view of the perforated shield in the embodiment of FIG. 1.

FIG. 3 is a cross-sectional view, somewhat schematic, of a second embodiment of plasma etching apparatus incorporating the invention.

In FIG. 1, the invention is illustrated in connection with a reactor having a generally cylindrical side wall 11 and an end wall 12. These walls define a reaction chamber 13, and access to the chamber is provided through a door (not shown) at the front of the chamber. The chamber walls are fabricated of a suitable material such as quartz.

An inlet port 16 is provided in the upper portion of side wall 11 and provides means for introducing reagent gases into the reaction chamber. An exhaust port 17 is provided in the lower portion of the side wall, and this port provides means for exhausting gases from the reaction chamber.

Electrode plates 21–24 are spaced circumferentially about the reaction chamber outside the chamber wall. Each of these plates has a generally cylindrical curvature. Upper plates 21 and 22 are connected electrically together and form two sections of a driven or "hot" electrode. Lower plates 23 and 24 are connected to ground and form two sections of a grounded electrode. Inlet port 16 is positioned between the two sections of the driven electrode, and exhaust port 17 is positioned between the two sections of the grounded electrode. Plates 21 and 22 are connected to the output of an RF generator 26.

A perforated screen 27 divides the reaction chamber into an upper region 28 and a lower region 29. The upper region is adjacent to driven electrode plates 21, 22, and the lower region is adjacent to the grounded electrode plates 23, 24. The shield has a semicylindrical body portion 31 and leg portions 32 which extend downwardly and outwardly from the lower extremities of the body portion. The body portion is positioned coaxially in the reaction chamber, with leg portions 32 resting on the chamber wall on opposite sides of the chamber to support the shield. Teflon runners 33 extend along the lower edges of the legs which rest upon the chamber wall to prevent damage to the reactor material.

The perforated shield is fabricated of an electrically conductive material such as aluminum. If desired, the metal body of the shield can be provided with a coating of dielectric material such as alumina or anodized aluminum. The shield can be fabricated as a unitary structure from a sheet of perforated aluminum bent to the desired contour.

The perforated shield can either float electrically or be connected to the grounded electrode. For this purpose, the shield is provided with a terminal 34 which extends rearwardly and passes through a feedthrough fitting (not shown) on the rear wall of the reactor. With a floating shield, this terminal is not connected to either of the electrodes. For a grounded shield, it is connected to electrode plates 23, 24 and to ground outside the reaction chamber.

Semiconductor wafers 36 are carried by a boat 37 in the lower region 29 of the reaction chamber. Other workpieces can likewise be supported by suitable means in the lower region of the chamber.

In operation, the wafers or other workpieces are positioned in the lower region of the reaction chamber, gas is admitted to the chamber through the inlet port, and the electrodes are energized to ionize the gas and form a plasma. The plasma is formed in the upper region 28 adjacent to the driven electrode, and the glow discharge of the plasma is confined to this region. The active species of the plasma, however, pass freely through the perforated shield and impinge upon the wafers or other workpieces in the lower region of the chamber. The spent gases are exhausted through the exhaust port. With the inlet port positioned between the two sections of the driven electrode, ionization of the incoming gas molecules is enhanced, and the sweeping effect of the laminar flow of the gas helps to bring the reactive components of the ionized gas into contact with the wafers or other workpieces.

This apparatus has all of the advantages of the perforated metal cylinder described in U.S. Pat. No. 3,879,597. It protects the wafers or other workpieces from ultraviolet radiation and ion bombardment. It permits the wafers to be etched at a faster rate without discernible attack of photoresist on the wafers, and the uniformity of the etch is also improved. In addition, photoresist can be removed or stripped up to about twice as fast as in a reactor having a perforated cylinder.

The embodiment of FIG. 3 is generally similar to the embodiment of FIG. 1, and like reference numerals designate corresponding elements in the two embodiments. In the embodiment of FIG. 3, however, the workpiece is placed in a perforated cylinder in the lower region of the reaction chamber. This cylinder can be fabricated of an electrically conductive metal such as aluminum, as described in U.S. Pat. No. 3,879,597, and it can be coated with a dielectric material such as alumina, if desired. The cylinder has radially extending legs 41 which rest upon the side wall 11 of the reaction chamber.

Operation and use of the embodiment of FIG. 3 is similar to that described above. The additional cylinder provides additional shielding which serves to further protect the wafers or other workpieces from radiation and ion bombardment.

It is apparent from the foregoing that a new and improved plasma etching apparatus has been provided. While only certain presently preferred embodiments have been described in detail, as will be apparent to those familiar with the art, certain changes and modifications can be made without departing from the scope of the invention as defined by the following claims.

We claim:

1. Plasma etching apparatus comprising a reaction chamber having a peripheral wall, means for introducing a reagent gas into the reaction chamber, a perforated shield extending between two points on the chamber wall and dividing the chamber into first and second regions on opposite sides of the shield, said first region being bounded by the shield and a first portion of the chamber wall and said second region being bounded by the shield and a second portion of the chamber wall, a driven electrode positioned outside the chamber wall adjacent to the first region, a grounded electrode positioned outside the chamber wall adjacent to the second region, and means for energizing the electrodes to ionize the gas and form a plasma of active species in the first region, said active species passing through the perforated shield and impinging upon a workpiece in the second region, the glow discharge of the plasma being confined to the first region.

2. The apparatus of claim 1 wherein the perforated shield is fabricated of an electrically conductive material.

3. The apparatus of claim 1 wherein the perforated shield comprises an electrically conductive metal body having a coating of dielectric material thereon.

4. The apparatus of claim 1 wherein the perforated shield comprises an aluminum body having a coating thereon selected from the group consisting of alumina and anodizing.

5. The apparatus of claim 1 wherein the perforated shield is fabricated of an electrically conductive material and is connected electrically to the grounded electrode.

6. The apparatus of claim 1 wherein the driven electrode is formed in two sections, and the means for introducing the reagent gas includes an inlet port positioned between the two sections.

7. The apparatus of claim 1 including a perforated cylinder of electrically conductive material positioned in the second region and surrounding the workpiece.

8. Plasma etching apparatus comprising a reaction chamber having a cylindrical side wall, means for introducing a reagent gas into the reaction chamber, a semi-cylindrical perforated shield positioned coaxially on the side wall with leg portions extending outwardly and engaging the side wall to divide the chamber into first and second regions on opposite sides of the shield, said first region being bounded by the shield and a first portion of the chamber wall and said second region being bounded by the shield and a second portion of the chamber wall, a driven electrode positioned outside the chamber wall adjacent to the first region, a grounded electrode positioned outside the chamber wall adjacent to the second region, and means for energizing the electrodes to ionize the gas and form a plasma of active species in the first region, said active species passing through the perforated shield and impinging upon a workpiece in the second region, the glow discharge of the plasma being confined to the first region.

9. In apparatus for plasma treatment of semiconductor wafers: a generally cylindrical wall defining a reaction chamber, a generally semicircular perforated shield positioned within the reaction chamber and having upwardly extending leg portions which engage the chamber wall on opposite sides of the chamber, said perforated shield dividing the chamber into first and second regions on opposite sides of the shield, means for introducing a reagent gas into the first region of the chamber, a driven electrode positioned outside the chamber wall adjacent to the first region, a grounded electrode positioned outside the chamber wall adjacent to the second region, and means for energizing the electrodes to ionize the gas and form a plasma of active species in the first region, said active species passing through the perforated shield and impinging upon semiconductor wafers in the second region, the glow discharge of the plasma being confined to the first region.

10. The apparatus of claim 9 wherein the perforated shield is fabricated of an electrically conductive material.

11. The apparatus of claim 9 wherein the perforated shield comprises an electrically conductive metal body having a coating of dielectric material thereon.

12. The apparatus of claim 9 wherein the perforated shield comprises an aluminum body having a coating thereon selected from the group consisting of alumina and anodizing.

13. The apparatus of claim 9 wherein the perforated shield is fabricated of an electrically conductive material and is connected electrically to the grounded electrode.

14. The apparatus of claim 9 wherein the driven electrode is formed in two sections, and the means for introducing the reagent gas includes an inlet port positioned between the two sections.

15. The apparatus of claim 9 including a perforated cylinder of electrically conductive material positioned in the second region and surrounding the workpiece.

16. In apparatus for use in a gas plasma reactor having a generally cylindrical side wall, a driven electrode on one side of the reaction chamber and a grounded electrode on a second side of the reaction chamber: a semi-cylindrical perforated metal shield positioned coaxially within the reaction chamber and having outwardly extending leg portions which engage the chamber walls on opposite sides of the chamber, said shield dividing the chamber into a first region adjacent to the grounded electrode and a second region adjacent to the driven electrode.

17. The apparatus of claim 16 wherein the shield comprises a perforated metal body and a coating of dielectric material on the metal body.

18. The apparatus of claim 16 wherein the perforated shield comprises an aluminum body having a coating thereon selected from the group consisting of alumina and anodizing.

* * * * *